United States Patent [19]

Lackey et al.

[11] Patent Number: 5,609,912
[45] Date of Patent: Mar. 11, 1997

[54] CERAMIC FABRIC FORMING METHOD

[75] Inventors: W. Jack Lackey, Marietta, Ga.; John A. Hanigofsky, Plano, Tex.

[73] Assignee: Georgia Tech Research Corp., Altanta, Ga.

[21] Appl. No.: 522,987

[22] Filed: Sep. 8, 1995

[51] Int. Cl.⁶ .................................................. B05D 7/00
[52] U.S. Cl. .................. 427/212; 427/227; 427/255.2; 427/372.2
[58] Field of Search .................. 427/227, 255.2, 427/212, 372.2

[56] References Cited

U.S. PATENT DOCUMENTS

| | | | |
|---|---|---|---|
| 3,385,915 | 5/1968 | Hamling | 264/5 |
| 3,485,657 | 12/1969 | Beaudry et al. | 117/46 |
| 3,508,954 | 4/1970 | White et al. | 117/106 |
| 3,943,330 | 3/1976 | Pollock et al. | 219/381 |
| 4,212,933 | 7/1980 | Markin et al. | 429/122 |
| 4,257,157 | 3/1981 | Pollock et al. | 29/611 |
| 4,500,483 | 2/1985 | Veltri et al. | 264/81 |
| 4,560,589 | 12/1985 | Endou et al. | 427/249 |
| 4,591,514 | 5/1986 | Holzl | 427/249 |
| 4,859,503 | 8/1989 | Bouix et al. | 427/249 |
| 4,921,725 | 5/1990 | Bouix et al. | 427/45.1 |
| 4,982,068 | 1/1991 | Pollock et al. | 392/488 |
| 5,156,883 | 10/1992 | Gruber et al. | 427/593 |

*Primary Examiner*—Benjamin Utech
*Attorney, Agent, or Firm*—Deveau, Colton & Marquis

[57] ABSTRACT

A method for forming a ceramic fabric by removing a carbon substrate from a fibrous preform by oxidation. Ceramic coated carbon fibers are laid-up in layers to form a preform. The layers generally have dimensions of from several inches to a few feet depending on the size of the preform. The carbon is exposed at any place where the fiber "ends" have been made by cutting the preform. The carbon core can be easily and economically oxidized at this point, leaving the ceramic coating as the ceramic fabric.

16 Claims, 2 Drawing Sheets

CERAMIC FABRIC FORMING METHOD

BACKGROUND OF THE INVENTION

1. Field of the Invention

The present invention relates generally to a method for forming ceramic fabrics by removing a carbon substrate from a fibrous preform and, more particularly, to a method for removing the carbon core from a fiber which has been coated by using a chemical vapor deposition (CVD) or other technique wherein the carbon core is removed from the fiber by oxidation after the fibers have been laid-up to form a preform. Once the fibers have been laid-up to form the preform, the distances between the fiber "ends" generally are small and therefore the cores can be more easily and economically oxidized.

2. Prior Art

The general idea of oxidizing the carbon core of an element produced by CVD is known. Veltri, et al., U.S. Pat. No. 4,500,483, discloses a process for the CVD manufacture of hollow silicon nitride articles by forming a substrate or pattern from carbon, coating the pattern by CVD of silicon nitride, selectively removing a portion of the coating to expose an area of the pattern, and oxidizing the pattern to form a hollow article. The Veltri, et al. process, however, is only applicable to large articles and was not developed or contemplated for fiber substrates on the micrometer level. Hamling, U.S. Pat. No. 3,385,915, discloses a process for producing metal oxide fibers, textiles, and shapes by first impregnating an organic preform with metal salts, and then heating the impregnated organic material to oxidize the carbon and convert the metal salt to a metal oxide. The Hamling process is directed to the fabrication of thin-walled tubes of the material itself and elements having complex shapes from preforms comprising fibers or woven textiles, and not to the removal of a carrying substrate. Pollock, et al., U.S. Pat. No. 4,982,068, discloses a heating element comprising a body of fibrous tubes by coating a carbon fiber with a material, such as SiC, and subsequently removing the carbon fiber core by cutting the coated tubes into appropriate lengths prior to oxidation. The Pollock, et al. process also is directed to large articles, specifically fluid tubes, and not to fabrics comprising hollowed fibers.

Until the present invention, it was not known to oxidize a carbon substrate of a fibrous preform, that is, to remove the substrate after the coated fibers have been weaved into a cloth and laid-up in layers to form the preform. The Pollock, et al. process discloses the removal of the carbon fiber core from a fibrous carbon precursor by oxidation; however, the problems associated with removing the carbon from coated carbon fibers which are relatively long is not confronted because the fibrous carbon precursor is cut into appropriate lengths prior to oxidation. In Pollock, et al., the fibrous carbon precursors range in length from 5 to 1000 millimeters prior to being coated by a plasma activated deposition process (PAVD). Once the fibrous carbon precursor has been coated using the PAVD coating process, the precursor is cut into appropriate lengths for oxidation. According to the examples provided in Pollock, et al., these lengths range from 12.3 millimeters to 15.0 millimeters. Therefore, the carbon comprising the fibrous carbon precursor can be easily oxidized due to the relatively short length of the coated precursor after it has been cut to facilitate oxidation of the carbon.

Many situations arise in which the distances between the ends of the carbon fibers comprising a manufactured article are not small, but are on the order of centimeters in length and, therefore, the oxygen cannot penetrate into the small fiber holes through the entire length of the fibers. Accordingly, a need exists in the industry for a method for removing the carbon substrate from a fibrous preform comprising relatively long lengths of fibers which can be conveniently and economically accomplished without requiring additional processing steps which may damage the fibrous preform.

SUMMARY OF THE INVENTION

It is generally known to use chemical vapor deposition to create a composite coated fiber tow by depositing a coating onto a fiber tow substrate. In a composite made from fibers having carbon core substrates, the carbon fibers will gradually oxidize. Such oxidation releases $CO_2$ and $CO$ gas which can bloat or otherwise damage the composite. One solution to this problem would be to remove the carbon substrate by oxidation after the coated fiber has been fabricated. However, this is not practical for long lengths of fiber because the oxygen cannot penetrate into the small diameter core (e.g. 5 micrometers) of a fiber that is hundreds of feet long. Accordingly, the present invention discloses a method for oxidizing the carbon cores of fibers after the fibers have been laid-up to form the preform. Since the distances between the fiber "ends" which have been created by creating the preform are relatively small, the carbon cores of the fibers can be easily and economically oxidized to remove the carbon fiber tow substrate.

A preferred embodiment of the present invention is directed to a method for the fabrication of fabrics by first coating a carbon fiber tow with a coating using chemical vapor deposition, weaving the coated carbon fiber tow into a cloth, laying up the cloth in various layers to form a fibrous preform, and oxidizing and removing the carbon fiber tow from the fabric, leaving a fabric comprised of generally hollow fibers of the coating material.

Specifically, the present invention provides a method for removing the carbon substrate from a composite comprised of a carbon fiber tow substrate having an outer coating of, for example, silicon carbide, deposited thereon by chemical vapor deposition or other methods. The composite consisting of the carbon fiber tow substrate and the outer coating is laid-up to form a fibrous preform or fabric. At this point, the carbon is exposed at any place where fiber "ends" have been made by cutting and forming the preform. Oxidation of the carbon substrate so as to remove it from the fabric then can be accomplished in an economic and convenient fashion. Other fiber preform forming methods can be used, such as using chopped fibers, woven or braided fiber, and filament winding of the fibers.

Accordingly, it is an object of the present invention to provide a method for removing a carbon substrate from a fibrous preform.

It is another object of the present invention to provide a method for removing a carbon substrate from a fibrous preform which is both convenient and economical.

It is yet another object of the present invention to provide a method for removing a carbon substrate from a fibrous preform which does not require the removal of a portion of the fiber coating.

Still another object of the present invention is to provide a method for the economical continuous production of silicon carbide fiber in a multifilament tow form.

Another object of the present invention is to provide a method for producing high purity, high density fiber using chemical vapor deposition.

A final object of the present invention is to provide a method for the fabrication of ceramic composites for use in high temperature applications by producing smaller diameter fibers.

These and offer objects, features and advantages of the present invention will become apparent to one skilled in the art from the following discussion, claims and drawings.

BRIEF DESCRIPTION OF THE DRAWINGS

FIG. 2b is a micrograph of a single SiC coated carbon fiber from FIG. 2a.

DETAILED DESCRIPTION OF THE INVENTION

Fabrics comprising small diameter ceramic fibers are needed for use in ceramic and metal matrix composites, particularly for use in defense and industrial applications. Silicon carbide is the preferred candidate material for such fabrics because of its low density and high temperature strength. By depositing a layer of SiC onto carbon fiber by CVD, and then producing a fabric from the SiC coated carbon fiber, the fabric properties become dominated by SiC since the preferred composite fabric is in the range of 89 volume percent SiC. A stochiometric CVD coating process possesses high strength and low porosity along with chemical purity and refractoriness which is lacking in available fibers and fabrics made by the sol gel or melt spinning processes.

The present invention is directed to using chemical vapor deposition or other deposition techniques to coat a carbon fiber substrate with a coating such as silicon carbide, weaving the coated fibers into a fabric layer, laying up at least one fabric layer to form a fibrous preform or fabric, and then removing the carbon fiber substrate by oxidation. Prior to discussing the process of the present invention for removing a carbon substrate by oxidation, the method and apparatus of the present invention for coating the carbon fiber substrates will be discussed.

In general, this invention is a processing technique for the fabrication of a fibrous preform or fiber. The preferred method of fabricating the continuous multifilament SiC fiber tow involves a two step process. First, SiC is deposited by chemical vapor deposition onto a moving multifilament carbon fiber tow. Second, during deposition, the fiber tow is spread apart by any commonly known spreading technique to prevent neighboring tows from adhering to each other. Using this preferred process for fabricating the continuous multifilament SiC fiber tow, or any commonly known method which will fabricate a continuous multifilament SiC fiber tow, a fiber suitable for further processing into the fabric of the present invention can be produced.

Figure 1:
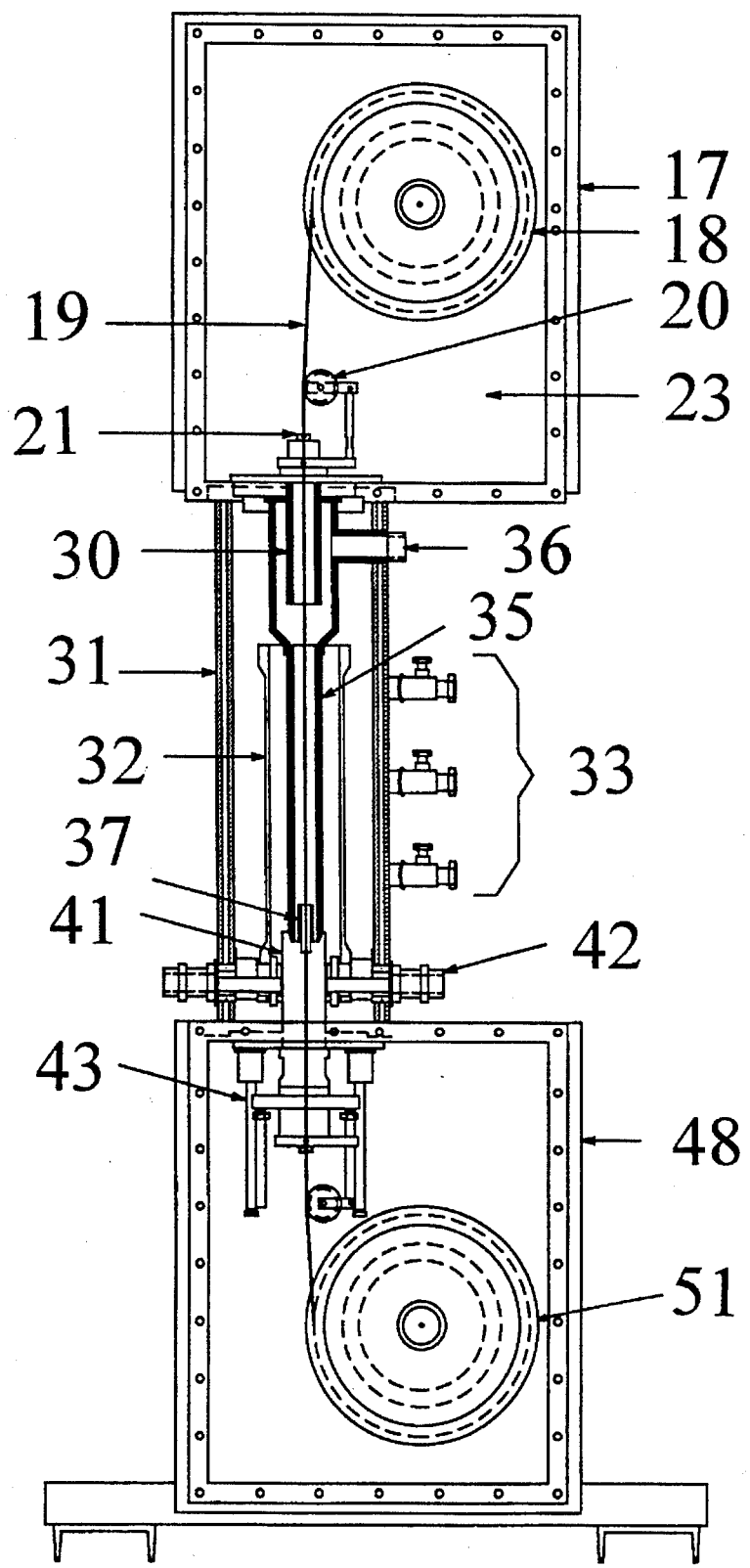
FIG. 1 illustrates a schematic diagram of a continuous fiber coating chemical vapor deposition furnace which allows fibers to be coated in a continuous fashion.

FIG. 1 illustrates a schematic diagram of the preferred continuous fiber CVD coating furnace of the present invention. The multifilament carbon fiber tow 19 is fed from a motorized spool 18 housed within a stainless steel enclosure 17 over a pulley 20 and into an orifice plate 21 through a protection tube 30 and into the reaction chamber 35 of a cold wall reactor 31. Site ports 33 are provided in the side of the cold wall reactor 31 as shown. The reagent stream consists of preferably methyltrichlorosilane (MTS=$CH_3SiCl_3$) and hydrogen which is used to carry the MTS vapor into the furnace through gas injector 41. However, it will be apparent to those skilled in the art that the type of coating deposited on the carbon substrate tow is not important to the primary object of the present invention, which is oxidation of the carbon substrate. The tow 19 is heated within the reactor 31 while being spread, as described below.

There is no preferred fiber spreading process, as any process which spreads the fibers preventing significant agglomeration of fibers is suitable. For example, the fibers may be spread by using a fiber vibration device which cyclically applies tension to the fiber tow and releases the fiber tow at periodic intervals. Also, passing the fibers over the rollers or pulleys 20 and 50 causes the fiber tow to spread to approximately 2.5 times its initial diameter. Pneumatic (Venturi-like) spreaders have also been used.

The reactive gas introduced into reactor 31 results in a coating being deposited on the fibers of the multifilament tow 19 while the fibers are spread apart, thereby enhancing the coating uniformity of the composite. Furthermore, the filaments of the tow 19, in accordance with the preferred embodiment, are constantly moving which minimizes or eliminates fiber agglomeration. Preferably, a silicon carbide coating is provided on the fibers of the multifilament tow. The coating thickness is preferably approximately 5 micrometers and the diameter of the carbon fibers being coated is preferably 5 micrometers, which results in a final fiber which is approximately 89 volume percent silicon carbide. In general, carbon fibers up to approximately 10 micrometers in diameter and coating thicknesses up to approximately 10 micrometers are preferred. In accordance with the preferred embodiment, methyltrichlorosilane and hydrogen are introduced into the reaction chamber 31 as the reagent and controlled using MKS mass flow controllers. The deposition occurs only at the heated surfaces, which in the case of the cold wall reactor is the fiber itself. Although both vacuum and atmospheric operating conditions have been used to deposit the coating, atmospheric pressure conditions are preferred since the vapor pressure of reactant is generally much higher under atmospheric pressure conditions than under vacuum conditions and the cost of vacuum equipment is avoided. Higher vapor pressures typically permit higher coating rates.

While multifilament fiber tows are preferred, the deposition can also be onto a carbon monofilament. Likewise, while silicon carbide is the preferred coating, other coatings can also be provided, such as for example, silicon nitride or aluminum oxide.

Once the coated fibers have been taken up on spool 51, a preform is formed. In a preferred embodiment, the fibers are weaved into cloth and laid-up in cloth layers to form a preform. The cloth layers, or other types of layers making up the preform, generally have dimensions of from several inches to a few feet depending on the size of the preform. The carbon substrates of the fibers are exposed at any place where fiber "ends" have been made by cutting the preform. At this point, the fabric is heated and oxidation of the carbon core can be accomplished relatively easily and economically, resulting in the fabric of the invention.

The fibers may be weaved into the cloth using typical fiber weaving methods. Alternatively, braided, 3-D weaves, and other weaves may be used as the preform. Additionally, as mentioned above, it is not necessary to have a cloth, but chopped fibers can be used. If a cloth is formed, once the fibers have been weaved into a cloth, the various cloths are laid up in layers to form the preform. The cloth layers may be oriented in any manner relative to each other. However, the typical orientations of 0°–45° and 0°–30°–60° result in a suitable final fabric product. Once the cloth layers have been laid up to form the fabric preform, the fabric preform is subjected to the oxidation step. Once the carbon fibers have been oxidized and the final fabric is formed, the fabric may be cut to the desired final product shape. Alternatively, the fibrous preform may be cut to the desired final product shape prior to oxidation. Also, the carbon core can be oxidized either before or after laying up the fabric layers to form the preform.

EXAMPLES

Figure 2B:
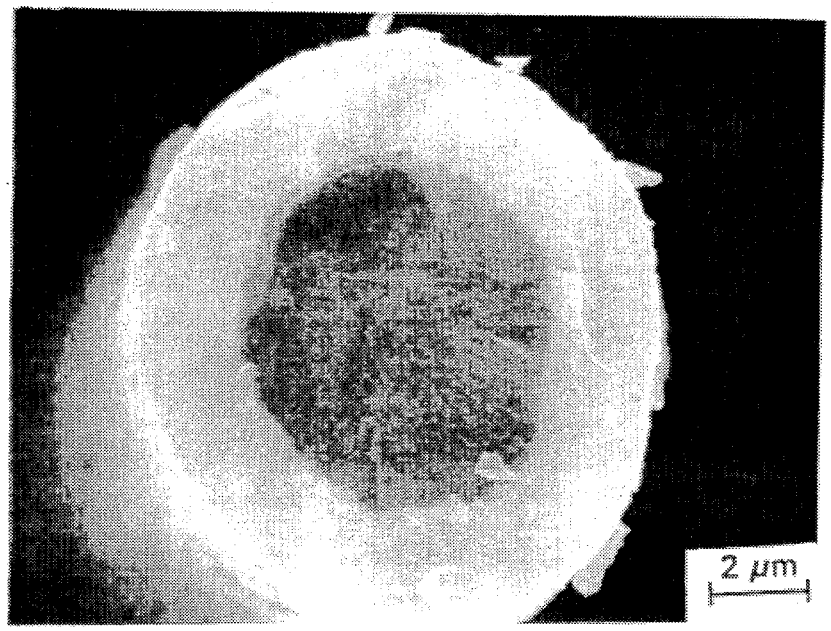
Figure 2A:
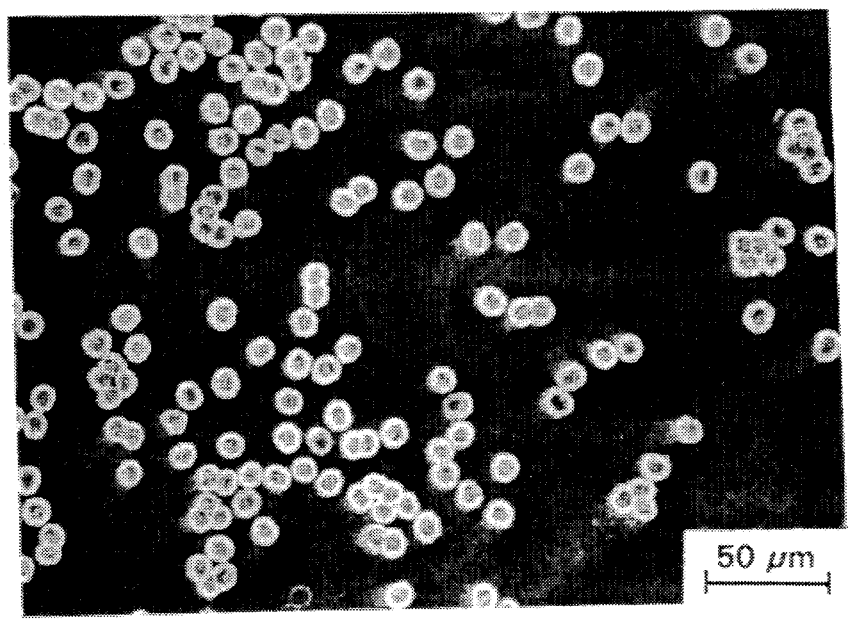
FIG. 2a is a micrograph of a bundle of representative SiC coated carbon fibers suitable for use in the method of the present invention.

Various runs using the stagnant, cold wall CVD system shown in FIG. 1 were conducted to optimize the fabrication of the continuous multifilament SiC fiber tow. The hydrogen diluent flow and pressure were varied in these runs. A summary of all of the runs is contained in Table 1. The coated fibers were characterized using SEM/EDS for microscopic and elemental analysis. Representative micrographs of the coated carbon fiber are shown in FIG. 2.

TABLE 1

| Run No. | Pressure (torr) | $H_2$/MTS (sccm) | MTS Rate (g/min) | $H_2$ Diluent (sccm) | Run Time (min) |
| --- | --- | --- | --- | --- | --- |
| FS-3 | 225 | 250 | — | 1000 | 10 |
| FS-4 | 225 | 63 | — | 500 | 4 |
| FS-5 | 70 | 50 | — | 500 | 10 |
| FS-7 | 36 | 50 | — | 500 | 5 |
| FS-8 | 600 | 50 | 1.2 | 500 | 4 |
| FS-9 | 40 | 50 | 2.4 | 1000 | 2.5 |
| FS-11 | 50 | 50 | 6.0 | 1000 | 5 |
| FS-12 | 30 | 50 | 4.1 | 1000 | 2 |
| FS-13 | 31 | 50 | 1.9 | 500 | 5 |
| FS-14 | 575 | 50 | — | 1000 | — |
| FS-15 | 575 | 50 | — | 1000 | 5 |
| FS-15a | 575 | 50 | — | 500 | — |
| FS-16 | 575 | 50 | — | 1000 | 3.5 |
| FS-17 | 20 | 50 | 1.3 | 1000 | 7 |
| FS-18 | 17 | 50 | 2.0 | 1000 | 5 |
| FS-19 | — | 50 | — | 1000 | — |
| FS-20 | 17 | 50 | 2.8 | 50 | 5 |
| FS-21 | 20 | 50 | 4.1 | 50 | 5 |
| FS-22 | 17 | 50 | 2.9 | 500 | 3 |
| FS-23 | — | 50 | — | 500 | — |
| FS-24 | 27 | 50 | 4.5 | 1000 | 5 |
| FS-25 | 18 | 50 | 2.7 | 50 | 5 |
| FS-26 | 10 | 50 | 0.7 | 500 | 2 |
| FS-27 | 19 | 50 | 3.4 | 500 | 5 |
| FS-28 | 515 | 50 | 1.0 | 500 | 5 |
| FS-29 | 26 | 100 | 4.8 | 500 | 5 |
| FS-30 | 35 | 100 | 4.9 | 1000 | 5 |
| FS-31 | 26 | 75 | 3.6 | 1000 | 5 |
| FS-32 | 450 | 75 | 1.9 | 1000 | 5 |
| FS-33 | 400 | 75 | 1.1 | 1000 | 3 |
| FS-35 | 37 | 50 | 2.8 | 500 | 7 |
| FS-36 | 60 | 50 | 2.5 | 500 | 5 |

Although the present invention has been described with respect to particular embodiments, it will be apparent to those skilled in the art that modifications to the method of the present invention can be made which are within the scope and spirit of the present invention.

We claim:

1. A method for forming a ceramic fabric formed of coated carbon fibers, comprising the steps of:

(a) depositing a coating of a ceramic onto a carbon fiber tow;

(b) weaving the coated carbon fiber tow into a textile;

(c) laying up the textile into at least one layer to form a fibrous preform such that the ends of the coated carbon fibers are exposed to the ambient; and (d) subjecting the fibrous preform to a temperature sufficient to oxidize the carbon fiber so as to remove a majority of the carbon fiber from the fibrous preform resulting in a ceramic fabric comprising the ceramic coating.

2. A method for forming a ceramic fabric according to claim 1, wherein said carbon fiber tow is a multifilament carbon fiber tow.

3. A method for forming a ceramic fabric according to claim 2, wherein said carbon fibers have a diameter of up to 10 microns.

4. A method for forming a ceramic fabric according to claim 3, wherein said coating is up to 5 microns in thickness.

5. A method for forming a ceramic fabric according to claim 4, wherein said coating is from 3 to 5 microns in thickness.

6. A method for forming a ceramic fabric according to claim 3, wherein said carbon fiber is between 3 and 7 microns thick.

7. A method for forming a ceramic fabric according to claim 2, wherein said carbon fibers are spread during deposition.

8. A method for forming a ceramic fabric according to claim 7, wherein said coating is silicon carbide.

9. A method for forming a ceramic fabric formed of coated carbon fibers, comprising the steps of:

(a) weaving the coated carbon fibers into a textile;

(b) depositing a coating of a ceramic onto the textile;

(c) cutting the textile such that ends of the coated carbon fibers are exposed to the ambient;

(d) laying up the textile into at least one layer to form a preform; and (e) subjecting the textile to a temperature sufficient to oxidize the carbon fibers so as to remove a majority of the carbon fiber from the textile resulting in a ceramic fabric comprising the ceramic coating.

10. A method for forming a ceramic fabric according to claim 9, wherein said carbon fiber tow is a multifilament carbon fiber tow.

11. A method for forming a ceramic fabric according to claim 10, wherein said carbon fibers have a diameter of up to 10 microns.

12. A method for forming a ceramic fabric according to claim 11, wherein said coating is up to 5 microns in thickness.

13. A method for forming a ceramic fabric according to claim 12, wherein said carbon fiber is between 3 and 7 microns thick.

14. A method for forming a ceramic fabric according to claim 13, wherein said coating is from 3 to 5 microns in thickness.

15. A method for forming a ceramic fabric according to claim 14, wherein said carbon fibers are spread during deposition.

16. A method for forming a ceramic fabric according to claim 15, wherein said coating is silicon carbide.

* * * * *